(12) United States Patent
Remington, Jr.

(10) Patent No.: US 8,795,773 B2
(45) Date of Patent: Aug. 5, 2014

(54) NANO-PARTICLE LOADED METAL OXIDE MATRIX COATINGS DEPOSITED VIA COMBUSTION DEPOSITION

(75) Inventor: Michael P. Remington, Jr., Toledo, OH (US)

(73) Assignee: Guardian Industries Corp., Auburn Hills, MI (US)

( * ) Notice: Subject to any disclaimer, the term of this patent is extended or adjusted under 35 U.S.C. 154(b) by 1654 days.

(21) Appl. No.: 12/076,100

(22) Filed: Mar. 13, 2008

(65) Prior Publication Data

US 2009/0233084 A1    Sep. 17, 2009

(51) Int. Cl.
  *C23C 16/00*   (2006.01)
  *C23C 16/40*   (2006.01)

(52) U.S. Cl.
  USPC .................. 427/255.19; 427/255.11

(58) Field of Classification Search
  CPC ............ B05D 1/12; B32B 5/16; B32B 17/06
  USPC ............................. 427/248.1–255.7
  See application file for complete search history.

(56) References Cited

U.S. PATENT DOCUMENTS

| | | | | |
|---|---|---|---|---|
| 5,652,021 A | * | 7/1997 | Hunt et al. | 427/248.1 |
| 5,750,265 A | * | 5/1998 | Goodman | 428/432 |
| 5,858,465 A | | 1/1999 | Hunt et al. | |
| 6,013,318 A | | 1/2000 | Hunt et al. | |
| 6,143,432 A | * | 11/2000 | de Rochemont et al. | 428/689 |
| 6,193,911 B1 | * | 2/2001 | Hunt et al. | 252/518.1 |
| 2002/0090521 A1 | * | 7/2002 | Nakajima et al. | 428/446 |
| 2007/0113881 A1 | | 5/2007 | Mellott et al. | |

FOREIGN PATENT DOCUMENTS

| | | |
|---|---|---|
| EP | 0 709 487 A1 | 5/1996 |
| EP | 1 602 633 | 12/2005 |
| EP | 1 887 059 A1 | 2/2008 |
| JP | 2005-249982 | 9/2005 |
| WO | WO 2009/106456 | 9/2009 |

OTHER PUBLICATIONS

International Search Report dated Dec. 23, 209.

(Continued)

*Primary Examiner* — David Turocy
*Assistant Examiner* — Michael G Miller
(74) *Attorney, Agent, or Firm* — Nixon & Vanderhye P.C.

(57) ABSTRACT

Certain example embodiments relate to coatings comprising nano-particle loaded metal oxide matrices deposited via combustion deposition. The matrix and the nano-particles comprising the coating may be of or include the same metal or a different metal. For example, the coating may include a silicon oxide matrix (e.g., $SiO_2$, or other suitable stoichiometry) having silicon oxide (e.g., silica), titanium oxide (e.g., $TiO_2$, titania, or other suitable stoichiometry), and/or other nano-particles embedded therein. In certain example embodiments, the coating may serve as an anti-reflective (AR) coating and, in certain example embodiments, a percent visible transmission gain of at least about 2.0%, and more preferably between about 3.0-3.5%, may be realized through the growth of a film on a first surface of the substrate. In certain example embodiments, the microstructure of the final deposited coating may resemble the microstructure of coatings produced by wet chemical (e.g., sol gel) techniques.

24 Claims, 4 Drawing Sheets

(56) References Cited

OTHER PUBLICATIONS

"Coating Material Composition for Displays, Lenses, Building Materials, etc.", Ide et al., vol. 2003, No. 38, May 1, 2003, Abstract.
"Development of Anti-Fogging Mirror Coated with $SiO_2$-$ZrO_2$-Colloidal $SiO_2$ Film by the Sol-Gel Process", Ogawa et al., Sol-Gel Products News, May 2003.
"Combustion Chemical Vapor Deposition: A Novel Thin-Film Deposition Technique", Hunt et al., 1993 American Institute of Physics, Apr. 21, 1993.
"Growth of Thin Films of Molybdenum and Tungsten Oxides by Combustion CVD using Aqueous Precursor Solutions", Davis et al., Chemical Vapor Deposition 2004, 10, No. 1, pp. 29-34.
U.S. Appl. No. 11/979,543, filed Nov. 5, 2007.
U.S. Appl. No. 12/000,784, filed Dec. 17, 2007.

\* cited by examiner

NANO-PARTICLE LOADED METAL OXIDE MATRIX COATINGS DEPOSITED VIA COMBUSTION DEPOSITION

FIELD OF THE INVENTION

Certain example embodiments of this invention relate to the deposition of metal oxide coatings onto substrates via combustion deposition. More particularly, certain example embodiments relate to the deposition of coatings comprising nano-particle loaded metal oxide matrices via combustion deposition. The matrix and the nano-particles comprising the coating may be of or include the same metal or a different metal. For example, the coating may include a silicon oxide matrix (e.g., $SiO_2$, or other suitable stoichiometry) having silicon oxide (e.g., silica), titanium oxide (e.g., $TiO_2$, titania, or other suitable stoichiometry), and/or other nano-particles embedded therein. In certain example embodiments, the coating may serve as an anti-reflective (AR) coating and, in certain example embodiments, a percent visible transmission gain of at least about 2.0%, and more preferably between about 3.0-3.5%, may be realized through the growth of a film on a first surface of the substrate. In certain example embodiments, the microstructure of the final deposited coating may resemble the microstructure of coatings produced by wet chemical (e.g., sol gel) techniques. In certain example embodiments, the composite coating may be hydrophilic and/or photo-catalytic.

BACKGROUND AND SUMMARY OF EXAMPLE EMBODIMENTS OF THE INVENTION

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. Another advantage is that combustion CVD techniques do not necessarily require volatile precursors. If a solution of the precursor can be atomized/nebulized sufficiently (e.g., to produce droplets and/or particles of sufficiently small size), the atomized solution will behave essentially as a gas and can be transferred to the flame without requiring an appreciable vapor pressure from the precursor of interest.

It will be appreciated that combustion deposition techniques may be used to deposit metal oxide coatings (e.g., single-layer anti-reflective coatings) on glass substrates, for example, to alter the optical and other properties of the glass substrates (e.g., to increase visible transmission). To this end, conventional combustion deposition techniques were used by the inventors of the instant application to deposit a single layer anti-reflective (SLAR) film of silicon oxide (e.g., $SiO_2$ or other suitable stoichiometry). The attempt sought to achieve an increase in light transmission in the visible spectrum (e.g., wavelengths of from about 400-700 nm) over clear float glass with an application of the film on one or both sides of a glass substrate. In addition, increases in light transmission for wavelengths greater the 700 nm are also achievable and also may be desirable for certain product applications, such as, for example, photovoltaic solar cells. The clear float glass used in connection with the description herein is a low-iron glass known as "Extra Clear," which has a visible transmission typically in the range of 90.3% to about 91.0%. Of course, the examples described herein are not limited to this particular type of glass, or any glass with this particular visible transmission.

The combustion deposition development work was performed using a conventional linear burner. As is conventional, the linear burner was fueled by a premixed combustion gas comprising propane and air. It is, of course, possible to use other combustion gases such as, for example, natural gas, butane, etc. The standard operating window for the linear burner involves air flow rates of between about 150 and 300 standard liters per minute (SLM), using air-to-propane ratios of about 15 to 25. Successful coatings require controlling the burner-to-lite distance to between about 5-50 mm when a linear burner is used.

Typical process conditions for successful films used a burner air flow of about 225 SLM, an air-to-propane ratio of about 19, a burner-to-lite distance of 35 mm, and a glass substrate velocity of about 50 mm/sec.

FIG. 1 is a simplified view of an apparatus 100 including a linear burner used to carry out combustion deposition. A combustion gas 102 (e.g., a propane air combustion gas) is fed into the apparatus 100, as is a suitable precursor 104 (e.g., via insertion mechanism 106, examples of which are discussed in greater detail below). Precursor nebulization (108) and at least partial precursor evaporation (110) occur within the apparatus 100 and also may occur external to the apparatus 100, as well. The precursor could also have been delivered as a vapor reducing or even eliminating the need for nebulization. The flame 18 may be thought of as including multiple areas. Such areas correspond to chemical reaction area 112 (e.g., where reduction, oxidation, and/or the like may occur), nucleation area 114, coagulation area 116, and agglomeration area 118. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 120. As will be appreciated from FIG. 1, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 100 for coating different portions of the substrate 22, may involve moving a single apparatus 100 while keeping the substrate in a fixed position, etc. The burner 110 is about 5-50 mm from the surface 26 of the substrate 22 to be coated.

Using the above techniques, the inventor of the instant application was able to produce coatings that provided a transmission gain of 1.96% or 1.96 percentage points over the visible spectrum when coated on a single side of clear float glass. The transmission gain may be attributable in part to some combination of surface roughness increases and air incorporation in the film that yields a lower effective index of refraction.

Although a percent change in $T_{vis}$ gain of about 2% is advantageous, further improvements are still possible. For example, optical modeling of these layers suggests that an index of refraction of about 1.33 for coatings that are about 100 nm thick should yield a transmission gain of about 3.0-3.5% or about 3.0-3.5 percentage points. The index of refraction of bulk density (e.g., no or substantially no air incorporation) silicon dioxide is nominally between about 1.45-1.5.

Furthermore, it would be desirable to approximate the properties obtained via sol-gel techniques. Sol-gel derived coatings of metal oxides (e.g., of silicon oxide) have been found to provide an increase in transmission of nominally about 3.5% over the visible spectrum when coated on a single side of clear float glass. For example, sol-gel coatings having a silicon oxide (e.g., $SiO_2$ or other suitable stoichiometry) based matrix which had silica nano-particles embedded therein were produced. The interaction of the silicon oxide matrix with the nano-particles produced a microstructure that gave rise to the coating's excellent AR properties.

Thus, it will be appreciated that there is a need in the art for improved techniques for depositing metal oxide coatings (e.g., anti-reflective coatings of, for example, silicon oxide) on glass substrates via combustion deposition, for combustion deposition techniques that yield coatings exhibiting properties comparable to those produced by the sol-gel processes noted above, and/or for metal oxide coatings having improved microstructures (e.g., metal oxide coatings having nano-particles embedded therein). It also may be possible to use the techniques described herein as a different method for controlling microstructures, in general.

According to certain example embodiments, to improve the percent change in $T_{vis}$ gain beyond the current levels of 1.96%, metal oxide coatings (e.g., silicon oxide coatings) may be produced using techniques that cause the microstructure of the coatings to emulate the microstructures of sol gel deposited coatings. The coatings produced in accordance with certain example embodiments possess an enhanced transmission increase over previously combustion deposition produced single-layer anti-reflective (SLAR or single-layer AR) coatings. This may be accomplished in certain example embodiments by providing intermixed or graded metal oxide coatings through nano-particle matrix loading of metal oxide coatings via combustion deposition. More particularly, it may be accomplished in certain example embodiments by using a precursor and by depositing surface passivated nano-particles from a finely atomized solution or colloid (which may be of or include the same or different metals) that respectively produce small nucleation particle size distributions and nano-particle size distributions to grow a coating where there is an increased number of air gaps with increased particle size, thereby reducing the index of refraction of the coating.

In certain example embodiments of this invention, a method of forming a coating on a glass substrate using combustion deposition is provided. A glass substrate having at least one surface to be coated is provided. A metal oxide based precursor and a metal oxide based nano-particle inclusive solution or colloid to be combusted by a flame are introduced. At least a portion of the precursor and the nano-particle inclusive solution or colloid are combusted to respectively form first and second combusted materials. The first and second combusted materials each comprise non-vaporized material. The glass substrate is provided in an area so that the glass substrate is heated sufficiently to allow the first and second combusted materials to form growths directly or indirectly, on the glass substrate. The first and second combusted materials respectively produce nucleation particle size distributions and nano-particle size distributions in forming the coating. The coating comprises a metal oxide matrix including metal oxide nano-particles embedded therein.

In certain example embodiments, a method of making a coating on a substrate using combustion deposition is provided. A glass substrate having at least one surface to be coated is provided. A metal oxide based precursor and a metal oxide based nano-particle inclusive solution or colloid to be combusted by a flame are introduced. At least a portion of the precursor and the nano-particle inclusive solution or colloid are combusted to respectively form first and second combusted materials. The first and second combusted material each comprise non-vaporized material. The glass substrate is provided in an area so that the glass substrate is heated sufficiently to allow the first and second combusted materials to form growths directly or indirectly, on the glass substrate. The precursor and the nano-particle inclusive solution or colloid respectively produce nucleation particle size distributions and nano-particle size distributions in forming the coating. The precursor and/or the nano-particle inclusive solution or colloid includes silicon oxide.

In certain example embodiments, a coated article including a coating supported by a glass substrate is provided. A combustion deposition deposited growth is arranged such that the growth comprises a matrix of small dense nucleation particle size distributions embedded with nano-particle size distributions. The nano-particle size distributions are deposited from a nano-particle inclusive solution or colloid. The coating increases visible transmission of the glass substrate by at least about 2.0% when coated on one side thereof.

In certain example embodiments, a method of making a coated article including a coating supported by a glass substrate is provided. A film comprising a metal oxide matrix having nano-particles embedded therein is formed. The metal oxide matrix is formed directly or indirectly on the substrate by combustion deposition depositing, via a precursor, a first combusted material that would produce small nucleation particle size distributions if coated independently while also combustion deposition depositing, via a nano-particle inclusive solution or colloid, in or on the small nucleation particle size distributions, a nano-particle size distribution. The second combusted material may or may not produce large agglomerate nano-particle size distributions if coated independently.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
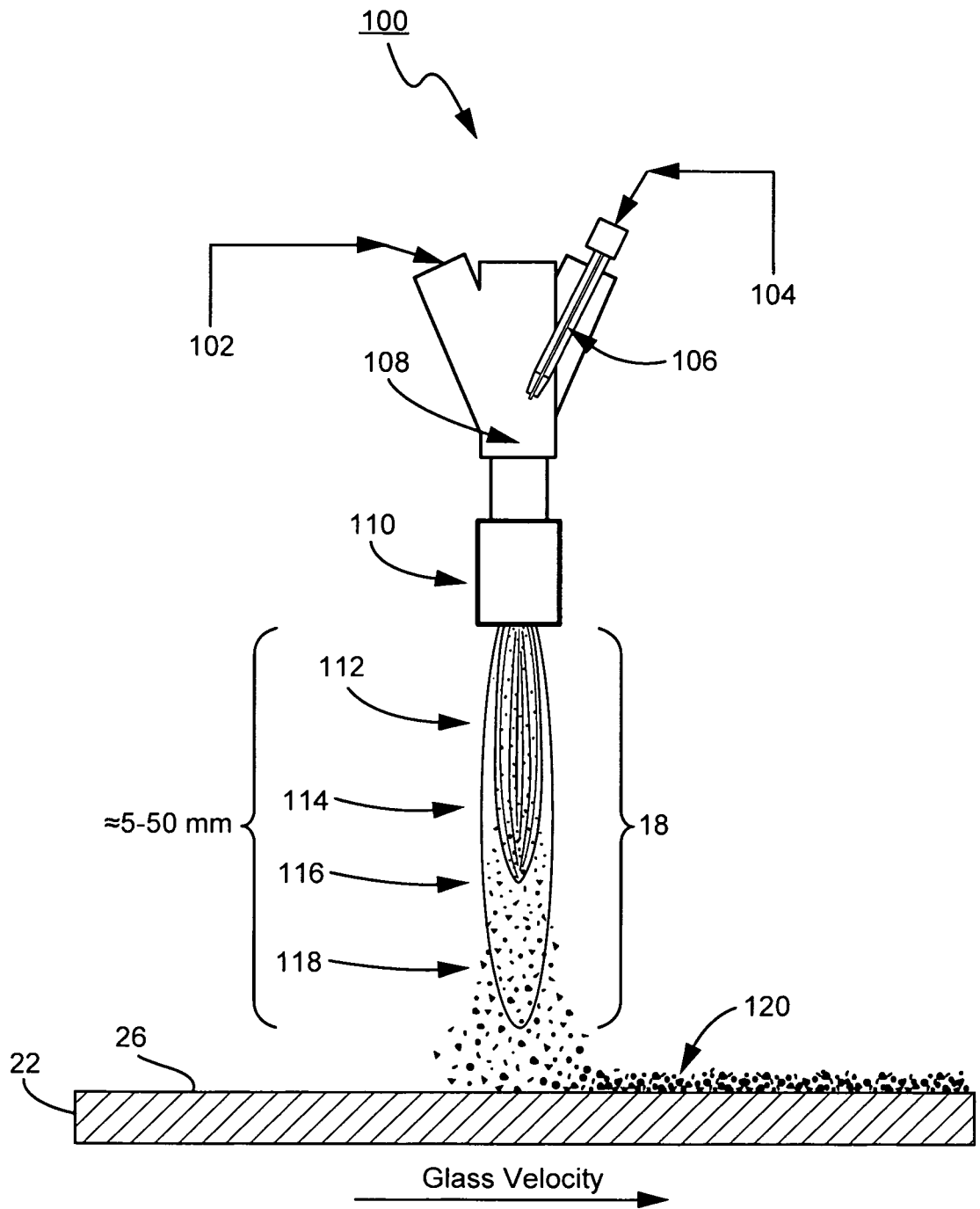
FIG. 1 is a simplified view of an apparatus including a linear burner used to carry out combustion deposition.

In certain example embodiments of this invention, a method of forming a coating on a glass substrate using combustion deposition is provided. A glass substrate having at least one surface to be coated is provided. A metal oxide based precursor and a metal oxide based nano-particle inclusive solution or colloid to be combusted by a flame are introduced. At least a portion of the precursor and the nano-particle inclusive solution or colloid are combusted to respectively form first and second combusted materials. The first and second combusted materials each comprise non-vaporized material. The glass substrate is provided in an area so that the glass substrate is heated sufficiently to allow the first and second combusted materials to form growths directly or indirectly, on the glass substrate. The first and second combusted materials respectively produce nucleation particle size distributions and nano-particle size distributions in forming the coating. The coating comprises a metal oxide matrix including metal oxide nano-particles embedded therein.

In certain example embodiments, a coated article including a coating supported by a glass substrate is provided. A combustion deposition deposited growth is arranged such that the growth comprises a matrix of dense, small nucleation particle size distributions embedded with nano-particle size distributions. The nano-particle size distributions are deposited from a nano-particle inclusive solution or colloid. The coating increases visible transmission of the glass substrate by at least about 2.0% when coated on one side thereof.

In certain example embodiments, a method of making a coated article including a coating supported by a glass substrate is provided. A film comprising a metal oxide matrix having nano-particles embedded therein is formed. The metal oxide matrix is formed directly or indirectly on the substrate by combustion deposition depositing, via a precursor, a first combusted material that would produce small, dense nucleation particle size distributions if coated independently while also combustion deposition depositing, via a nano-particle inclusive solution or colloid, in or on the small nucleation particle size distributions. The second combusted material may or may not produce large agglomerate nano-particle size distributions if coated independently.

In certain example embodiments, a fuel gas and oxygen source is selected and mixed together to form a combustion gas mixture. At least a portion of the combustion gas mixture is used in forming the coating. A precursor and a finely atomized surface passivated metal oxide nano-particle inclusive solution or colloid are selected such that at least a portion of the combustion products form a coating with desired properties. The precursor and the solution or colloid are introduced into the combustion gas stream to form a reagent mixture. Using at least one flame, at least a portion of the reagent mixture is reacted via combustion to form reaction products, with at least a portion of the reaction products comprising non-vaporized material. Films produced by the precursor and the solution or colloid are grown on the substrate such that a coating is produced, the coating comprising a mixture of small, dense nucleation particle size distributions and nano-particle size distributions. The coating increases visible transmission of the glass substrate by at least about 2.0% and, more preferably, by between about 3.0-3.5% when coated on one side thereof.

In certain example embodiments, to improve the percent change in $T_{vis}$ gain beyond the current levels of 1.96%, metal oxide coatings (e.g., silicon oxide coatings) may be produced using techniques that cause the microstructure of the coatings to emulate the microstructures of sol gel deposited coatings. The coatings produced in accordance with certain example embodiments possess an enhanced transmission increase over previously combustion deposition produced single-layer anti-reflective (SLAR or single-layer AR) coatings. This may be accomplished in certain example embodiments by providing intermixed or graded metal oxide coatings through nano-particle matrix loading of metal oxide coatings via combustion deposition. More particularly, it may be accomplished in certain example embodiments by using a precursor and by depositing surface passivated nano-particles from a finely atomized solution or colloid (which may be the same or different precursors) that respectively produce small nucleation particle size distributions and nano-particle size distributions to grow a coating where there is an increased number of air gaps with increased particle size, thereby reducing the index of refraction of the coating.

Certain example embodiments use a burner system that receives a precursors and a finely atomized solution or colloid comprising surface passivated nano-particles provided to the combustion gas stream. The precursor is combusted so as to produce small nucleation particle size distributions growths or films resulting in a dense matrix or binding metal oxide coating, with the small nucleation particle size distributions being preferably less than about 10 nm (e.g., for silicon oxide based coatings). Such particle sizes may be achieved using low concentrations of precursor in the combustion stream. The finely atomized solution or colloid comprising the surface passivated nano-particles is provided to the combustion stream so as to produce a distribution of nano-particles (e.g., in the range of about 10-100 nm, more preferably in the range of about 10-15 nm) that may or may not produce less dense growths or films if coated independently. If coated independently, the nano-particles may or may not result in a film with an index of refraction range of about 1.25-1.42 for silicon oxide based coatings. Such growths or films may be achieved by forming a colloid or solution including about 15-40% nano-particles by weight. In certain example implementations, the process conditions include a flame temperature of between about 1000-1400° C., an air-to-propane ratio of about 15-30, and an air flow rate of between about 100-300 standard liters per minute.

In certain example embodiments, the composite coating may be hydrophilic and/or photo-catalytic.

Silicon oxide (e.g., $SiO_2$ or other suitable stoichiometry) coatings made in accordance with certain example embodiments may use the precursor hexamethyldisiloxane (HMDSO). Other precursors, such as tetraethylorthosilicate (TEOS), silicon tetrachloride (e.g., $SiCl_4$ or other suitable stoichiometry), and the like, may be used. Of course, it will be appreciated that other metal oxide precursors may be used, for example, as the invention is not limited to deposition of silicon dioxide coatings.

The resulting coating therefore may contain a metal oxide matrix (e.g., a silicon oxide matrix) with embedded nano-particles. The coating will possess a microstructure similar to that of coatings produced by sol-gel and provide enhanced anti-reflective properties and perhaps enhanced chemical and/or mechanical durability when compared to coatings deposited without the flux of nanoparticles. Such properties may include, for example, reduced reflection and/or increased visible transmission or increased light transmission at higher wavelengths.

It will be appreciated that the precursor and the nano-particles in the solution or colloid may be of or include the same or different metals. It also will be appreciated that is possible to deposit composite films, or films having a matrix of or including a first metal oxide and also having embedded therein nano-particles of a second metal oxide, the second metal oxide being different from the first metal oxide. By way of example, it is possible to include titanium oxide (e.g., $TiO_2$, titania, or other suitable stoichiometry) nano-particles in a matrix of or including silicon. Such composite coatings advantageously may incorporate the advantages of one or both materials. For example, a silicon dioxide-inclusive matrix including titanium oxide nano-particles embedded therein may provide some of the self-cleaning properties of conventional titanium oxide coatings, have a more neutral color appearance than conventional titanium oxide coatings, and be less reflective than conventional titanium oxide coatings.

Figure 2:
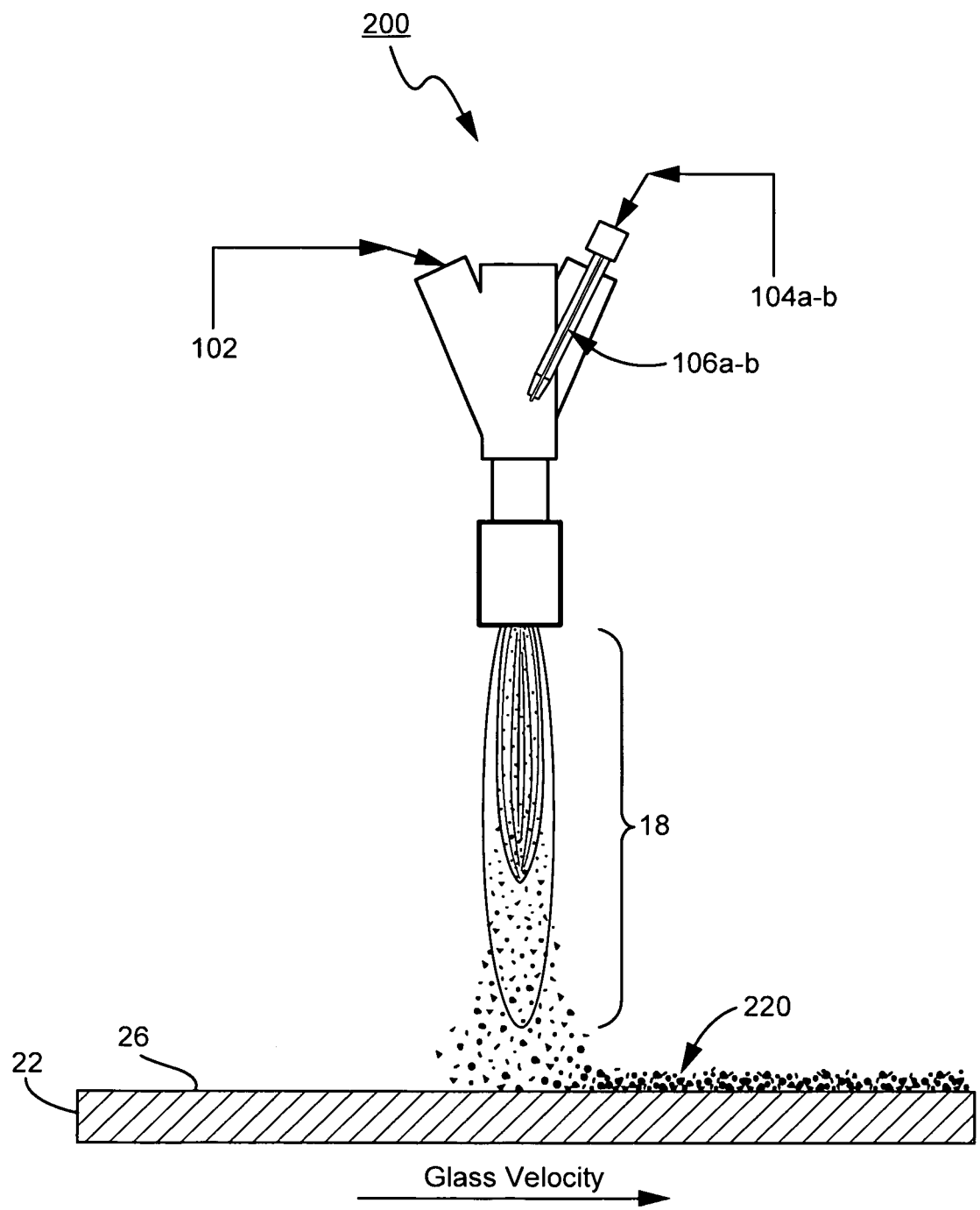
FIG. 2 is a simplified view of an illustrative burner system used to carry out combustion deposition in accordance with an example embodiment.

FIG. 2 is a simplified view of an illustrative burner system 200 used to carry out combustion deposition in accordance with an example embodiment. FIG. 2 is similar to FIG. 1, except that the precursor 104a and the finely atomized solution or colloid comprising the surface passivated nano-particles 104b are added to the combustion gas stream 102 via insertion mechanisms 106a-b, respectively. The insertion mechanisms 106a-b may be the same or different insertion system(s), and/or may be provided at the same or different location(s). More particularly, a finely atomized solution or colloid of surface passivated nano-particles is injected into the combustion gas stream. At substantially the same time, a precursor is introduced into the combustion gas stream as a vapor, atomized liquid, or atomized solution. The precursor 104a is selected so that, when combusted by the flame 18, small nucleation particle size distributions are deposited directly or indirectly on the surface to be coated 26 of the substrate 22. The solution or colloid 104b is selected so that, when combusted by the flame 18, nano-particle size distributions also are grown directly or indirectly in or on the small nucleation particle size distributions and/or the substrate. By way of example, if coated independently, the small nucleation particle size distributions may produce a film having an index of refraction of about 1.43-1.46 for silicon oxide based coatings, whereas if coated independently the nano-particle size distributions may or may not produce a film having an index of refraction of about 1.25-1.43 for silicon oxide based coatings. Thus, in certain example embodiments, nano-particles may be loaded into a small nucleation particle matrix when forming the coating. When depositing silicon oxide coatings, the precursor may be hexamethyldisiloxane (HMDSO) or decamethylcyclopentasiloxane (or D5). Other precursors, such as tetraethylorthosilicate (TEOS), silicon tetrachloride (e.g., $SiCl_4$ or other suitable stoichiometry), and the like, may be used.

Figure 3:
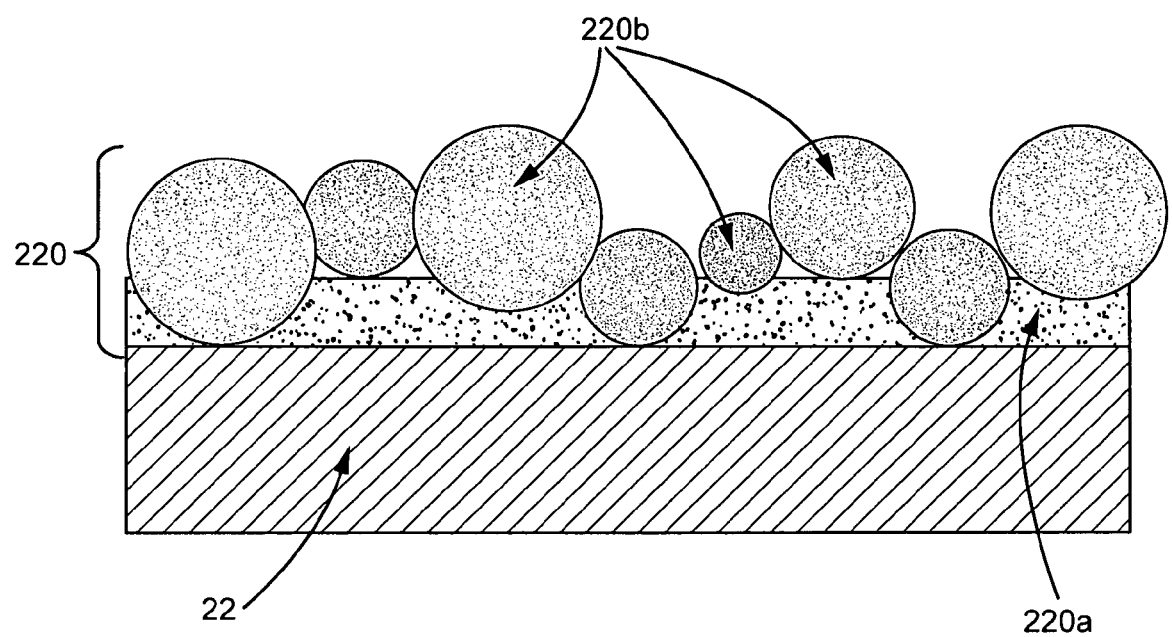
FIG. 3 is a coated article including a coating supported by a substrate in accordance with an example embodiment.

FIG. 3 is a coated article including a coating 220 supported by a substrate 22 in accordance with an example embodiment. The coating 220 is deposited by combustion deposition in one of the above-described and/or other techniques. The coating 220 is a mixture such that the refractive index can be adjusted to the desired level by varying the size distribution from the device producing the nano-particle size distributions. In certain example embodiments, the films made with process conditions that produce small nucleation particle size distributions is located closest to the substrate 22 to improve layer adhesion. Also, the metal oxide coating matrices include nano-particles embedded therein via combustion deposition.

Thus, at least two combustion deposition deposited growths are arranged such that the growths collectively comprise generally a mixture growth of dense, small particle distributions 220a and nano-particle particle distributions 220b, and at least two combustion deposition deposited growths 220a-b collectively form a metal oxide matrix including nano-particles, the nano-particles being embedded therein. It will be appreciated that the growths are generally mixtures in the sense that the growths comprising the coating 220 are not completely or entirely discrete. Thus, growths may be "in," "on" and/or "supported by" other growths in a generally mixed or graded manner, with some of a first or second growth possibly being located partially within a second or first growth, respectively. Furthermore, while the layer mixture or coating 220 is "on" or "supported by" substrate 22 (directly or indirectly), other layer(s) may be provided therebetween. Thus, for example, coating 220 of FIG. 3 may be considered "on" and "supported by" the substrate 22 even if other layer(s) are provided between growth 220a and substrate 22. Moreover, certain growths or layers of coating 220 may be removed in certain embodiments, while others may be added in other embodiments of this invention without departing from the overall spirit of certain embodiments of this invention. It will be appreciated that the refractive index may be adjusted or tuned by varying the number of nano-particles in the matrix and/or by varying the concentration of nano-particles in the colloid or solution.

Figure 4:
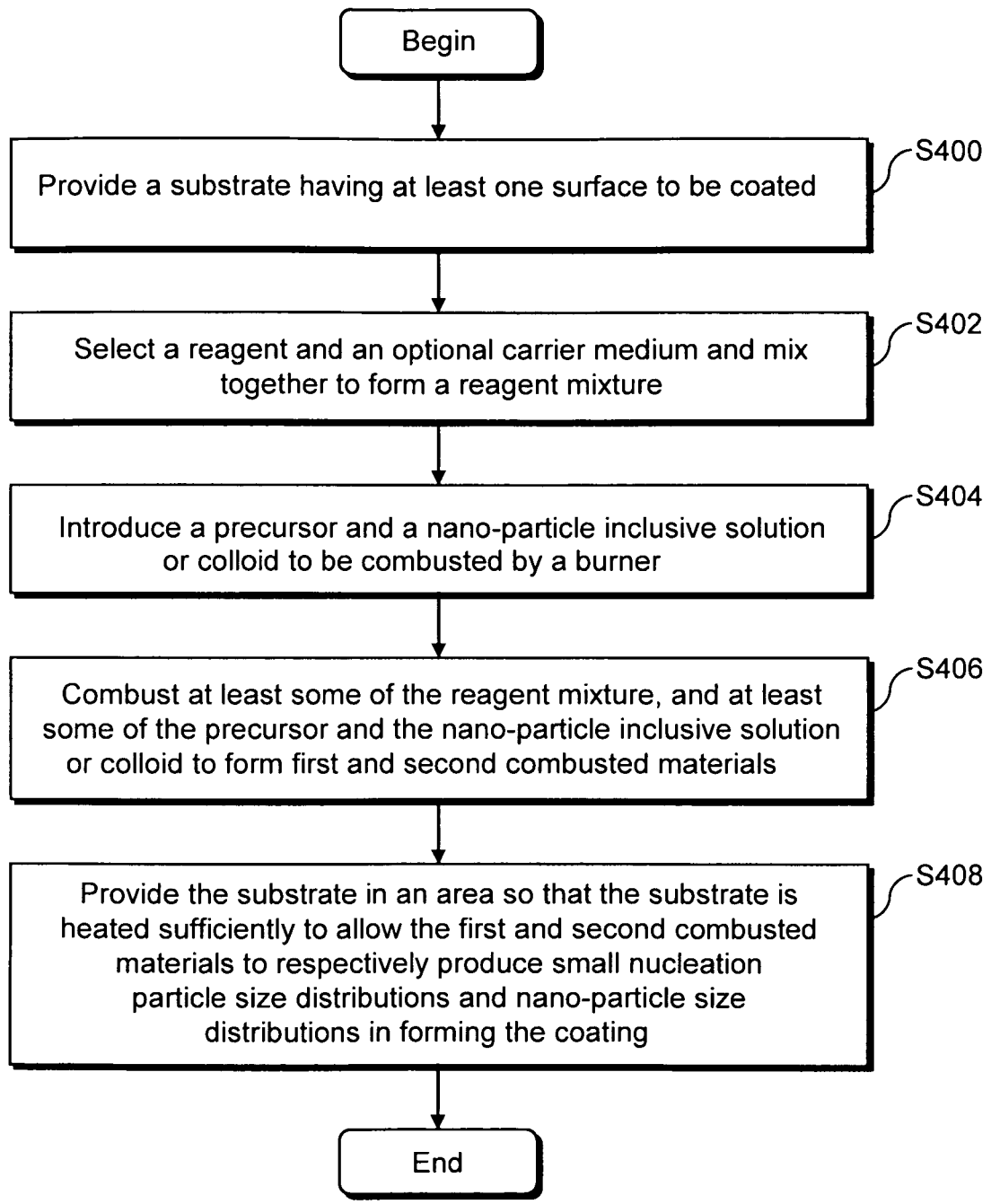
FIG. 4 is an illustrative flowchart illustrating a process for applying a nano-particle loaded metal oxide coating to a glass substrate using combustion deposition in accordance with an example embodiment.

FIG. 4 is an illustrative flowchart illustrating a process for applying an nano-particle loaded metal oxide (e.g., anti-reflective or AR) coating to a glass substrate using combustion deposition in accordance with an example embodiment. In step S400, a substrate (e.g., a glass substrate) having at least one surface to be coated is provided. A reagent and an optional carrier medium are selected and mixed together to form a reagent mixture in step S402. The reagent is selected so that at least a portion of the reagent forms the coating. A precursor and a nano-particle inclusive solution or colloid to be combusted using a burner are introduced in step S404. In step S406, at least a portion of the reagent mixture, and at least a portion of the precursor and the nano-particle inclusive solution are combusted, thereby respectively forming first and second combusted materials. The precursor and the nano-particle inclusive solution or colloid may be introduced by a number of means. For example, the precursor may be introduced in a vapor state via a bubbler, as large particle droplets via an injector, and/or as small particle droplets via a nebulizer. Also, the nano-particle inclusive solution or colloid may be injected into the combustion stream, for example. In step S408, the substrate is provided in an area so that the substrate is heated sufficiently to allow the first and second combusted materials to respectively produce small, dense nucleation particle size distributions and nano-particle size distributions in forming the coating on the substrate. The small nucleation particle size distributions and/or nano-particle size distributions may be formed either directly or indirectly on the substrate. Also, the small nucleation particle size distributions and/or nano-particle size distributions may be mixed, e.g., as shown in FIG. 3. The small nucleation particle size distributions and/or nano-particle size distributions may be the same or different metal oxides.

Also, optionally, in one or more steps not shown, the opposing surface of the substrate also may be coated. Also optionally, the substrate may be wiped and/or washed, e.g., to remove excess particulate matter deposited thereon.

As noted, the combusted materials may include particulate matter of varying sizes. The particulate matter included in the combusted material may be individual particles or may actually be agglomerations and/or aggregations of multiple particles. Thus, when the size of the particles and/or particulate matter produced is discussed herein, the sizes refer to the total size of either the sizes of the individual particles or the total sizes of the agglomerations. Moreover, the individual particles or particle agglomerations produced may be somewhat differently sized. Accordingly, the sizes specified herein refer to respective size distribution means.

Given the above descriptions, the films of certain example embodiments may be thought of as including a layer of larger particles deposited with a layer of smaller particles (e.g., made using the precursor) acting as a "glue" to hold the larger particles (e.g., made using the finely atomized solution or colloid comprising the surface passivated nano-particles) in place, filling in some gaps, and also sealing in some air. The resulting film therefore may be considered a mixed or graded film, as noted above. Furthermore, in certain example embodiments, the film may get rougher as more is deposited such that it is considered a graded layer.

The nano-particle inclusive solutions or colloids of certain example embodiments may be manufactured or purchased from a commercial source (e.g., from Nissan Chemical, TiOxo Clean, etc.).

It also will be appreciated that the techniques described herein can be applied to a variety of metal oxides, and that the present invention is not limited to any particular type of metal oxide deposition and/or precursor. For example, oxides of the transition metals and lanthanides such as, for example, Y, Ti, Zr, Hf, V, Nb, Ta, Cr, Mo, W, La, Ce, Cr, Mo, W, Mn, Fe, Ru, Co, Ir, Ni, Cu, and main group metals and metalloids such as, for example, Zn, Cd, B, Al, Ga, In, Si, Ge, Sn, Sb and Bi, and mixtures thereof can all be deposited using the techniques of certain example embodiments.

It will be appreciated that the foregoing list is provided by way of example. For example, the metal oxides identified above are provided by way of example. Any suitable stoichiometry similar to the metal oxides identified above may be produced. Additionally, other metal oxides may be deposited, other precursors may be used in connection with these and/or other metal oxide depositions, the precursor delivery techniques may be altered, and/or that other potential uses of such coatings may be possible. Still further, the same or different precursors may be used to deposit the same or different metal oxides for the metal oxide matrix coating and/or the embedded nano-particles.

Also, it will be appreciated that the techniques of the example embodiments described herein may be applied to a variety of products. That is, a variety of products potentially may use these and/or other AR films, depending in part on the level of transmission gain that is obtained. Such potential products include, for example, photovoltaic, green house, sports and roadway lighting, fireplace and oven doors, picture frame glass, etc. Non-AR products also may be produced.

The example embodiments described herein may be used in connection with other types of multiple layer AR coatings, as well. By way of example and without limitation, multiple reagents and/or precursors may be selected to provide coatings comprising multiple layers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of forming a coating on a glass substrate using combustion deposition, the method comprising:
    providing a glass substrate having at least one surface to be coated;
    introducing a metal oxide based precursor and a metal oxide based nano-particle inclusive solution or colloid to be combusted by a flame;
    combusting at least a portion of the precursor and the nano-particle inclusive solution or colloid to respectively form first and second combusted materials, the first and second combusted materials each comprising non-vaporized material; and
    providing the glass substrate in an area so that the glass substrate is heated sufficiently to allow the first and second combusted materials to form growths directly or indirectly, on the glass substrate,
    wherein the first and second combusted materials respectively produce nucleation particle size distributions and nano-particle size distributions in forming the coating, and
    wherein the coating comprises a metal oxide matrix including metal oxide nano-particles embedded therein.

2. The method of claim 1, wherein the coating comprises an oxide of silicon.

3. The method of claim 2, wherein the nucleation particle size distribution has a particle size distribution mean less than about 10 nm and would produce a film having an index of refraction of between about 1.43-1.46 if coated independently.

4. The method of claim 2, wherein the nano-particle size distribution has a particle size distribution mean of between about 10-100 nm.

5. The method of claim 2, wherein the coating comprises a silicon oxide matrix including nano-particles, the nano-particles being embedded therein.

6. The method of claim 5, wherein the coating comprises silica nano-particles.

7. The method of claim 6, further comprising injecting the nano-particle inclusive solution or colloid into a combustion gas stream in producing the nano-particle size distributions, the nano-particle inclusive solution or colloid comprising surface passivated nano-particles.

8. The method of claim 5, wherein the coating comprises titania nano-particles.

9. The method of claim 1, wherein the coating increases visible transmission of the glass substrate by at least about 2.0% when coated on one side thereof.

10. The method of claim 1, wherein the coating increases visible transmission of the glass substrate by between about 3.0-3.5% when coated on one side thereof.

11. The method of claim 1, further comprising introducing the precursor as a vapor, atomized liquid, or atomized solution into a combustion gas stream.

12. The method of claim 1, wherein the nano-particle inclusive solution or colloid is introduced as a finely atomized nano-particle inclusive solution or colloid comprising surface passivated nano-particles.

13. The method of claim 1, further comprising injecting the nano-particle inclusive solution or colloid into a combustion gas stream in producing the nano-particle size distributions, the nano-particle inclusive solution or colloid comprising surface passivated nano-particles.

14. The method of claim 1, further comprising depositing at least one additional coating via combustion deposition on a second surface of the glass substrate.

15. The method of claim 1, wherein the nucleation particle size distributions and the nano-particle size distributions respectively comprise first and second metal oxides, the first metal oxide being different from the second metal oxide.

16. The method of claim 1, wherein the nucleation particle size distributions have a particle size distribution mean less than 10 nm, and wherein the nano-particle size distributions have a particle size distribution mean of greater than 10 nm and less than 100 nm.

17. A method of making a coating on a substrate using combustion deposition, the method comprising:
    providing a glass substrate having at least one surface to be coated;

introducing a metal oxide based precursor and a metal oxide based nano-particle inclusive solution or colloid to be combusted by a flame;

combusting at least a portion of the precursor and the nano-particle inclusive solution or colloid to respectively form first and second combusted materials, the first and second combusted material each comprising non-vaporized material; and providing the glass substrate in an area so that the glass substrate is heated sufficiently to allow the first and second combusted materials to form growths directly or indirectly, on the glass substrate, wherein the precursor and the nano-particle inclusive solution or colloid respectively produce nucleation particle size distributions and nano-particle size distributions in forming the coating, wherein the precursor and/or the nano-particle inclusive solution or colloid includes silicon oxide.

18. The method of claim 17, wherein the nucleation particle size distributions has a particle size distribution mean less than about 10 nm and would produce a film having an index of refraction of between about 1.43-1.46 if coated independently.

19. The method of claim 17, wherein the nano-particle size distribution has a particle size distribution mean of between about 10-100 nm.

20. The method of claim 17, wherein the coating increases visible transmission of the glass substrate by between about 3.0-3.5% when coated on one side thereof.

21. The method of claim 17, wherein precursor and the nano-particle inclusive solution or colloid include silicon oxide.

22. The method of claim 17, wherein the nucleation particle size distributions have a particle size distribution mean less than 10 nm, and wherein the nano-particle size distributions have a particle size distribution mean of greater than 10 nm and less than 100 nm.

23. A method of making a coated article including a coating supported by a glass substrate, the method comprising:

forming a film comprising a metal oxide matrix having nano-particles embedded therein, wherein the metal oxide matrix is formed directly or indirectly on the substrate by combustion deposition depositing, via a precursor, a first combusted material that would produce small nucleation particle size distributions if coated independently while also combustion deposition depositing, via a nano-particle inclusive solution or colloid, in or on the small nucleation particle size distributions, a nano-particle size distribution.

24. The method of claim 23, wherein the nucleation particle size distributions have a particle size distribution mean less than 10 nm, and wherein the nano-particle size distributions have a particle size distribution mean of greater than 10 nm and less than 100 nm.

* * * * *